US010840325B2

(12) United States Patent
Maniscalco et al.

(10) Patent No.: US 10,840,325 B2
(45) Date of Patent: Nov. 17, 2020

(54) LOW RESISTANCE METAL-INSULATOR-METAL CAPACITOR ELECTRODE

(71) Applicant: International Business Machines Corporation, Armonk, NY (US)

(72) Inventors: Joseph F. Maniscalco, Lake Katrine, NY (US); Koichi Motoyama, Clifton Park, NY (US); Oscar van der Straten, Guilderland Center, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 28 days.

(21) Appl. No.: 15/950,209

(22) Filed: Apr. 11, 2018

(65) Prior Publication Data
US 2019/0319088 A1    Oct. 17, 2019

(51) Int. Cl.
*H01L 23/522* (2006.01)
*H01L 49/02* (2006.01)

(52) U.S. Cl.
CPC .......... *H01L 28/75* (2013.01); *H01L 23/5223* (2013.01)

(58) Field of Classification Search
CPC .......... H01L 23/5223; H01L 28/40–92; H01G 4/306; H01G 4/33
See application file for complete search history.

(56) References Cited

U.S. PATENT DOCUMENTS

| | | | |
|---|---|---|---|
| 6,329,234 B1 | 12/2001 | Ma et al. | |
| 6,451,664 B1 | 9/2002 | Barth et al. | |
| 7,091,542 B1 | 8/2006 | Yang et al. | |
| 7,332,764 B2 | 2/2008 | Choi et al. | |
| 9,449,874 B1* | 9/2016 | Standaert | H01L 21/76877 |
| 2002/0019123 A1 | 2/2002 | Ma et al. | |
| 2002/0102809 A1* | 8/2002 | Barth | H01L 28/60 |
| | | | 438/393 |
| 2003/0102531 A1* | 6/2003 | Joshi | H01L 23/642 |
| | | | 257/629 |
| 2005/0218519 A1 | 10/2005 | Koike et al. | |
| 2006/0197183 A1 | 9/2006 | Yang et al. | |
| 2007/0012973 A1* | 1/2007 | Nasu | H01L 21/7687 |
| | | | 257/295 |
| 2007/0155113 A1* | 7/2007 | Roberts | H01L 28/40 |
| | | | 438/396 |

(Continued)

OTHER PUBLICATIONS

Koike et al., "Cu alloy metallization for self-forming barrier process". In IEEE International Interconnect Technology Conference, pp. 161-163 (2006).

(Continued)

*Primary Examiner* — Bryan R Junge
(74) *Attorney, Agent, or Firm* — Cantor Colburn LLP; James Nock (57) ABSTRACT

Integrated circuits including metal-insulator-metal capacitors (MIMCAPs) generally include a diffusion barrier layer on the top and bottom surfaces of the electrode and a self-formed oxide layer on sidewalls of the electrode. The diffusion barrier layers and the self-formed oxide layers on the sidewalls of the electrode prevent diffusion of the metal defining the electrode into the interlayer dielectric. Also described are processes for fabricating the MIMCAPs.

19 Claims, 4 Drawing Sheets

(56) References Cited

U.S. PATENT DOCUMENTS

| | | | | |
|---|---|---|---|---|
| 2007/0170482 A1* | 7/2007 | Shimojo | ............... | H01L 28/65 257/296 |
| 2011/0193194 A1* | 8/2011 | Takahashi | ............... | H01L 28/75 257/532 |
| 2013/0187273 A1 | 7/2013 | Zhang et al. | | |
| 2015/0171161 A1* | 6/2015 | Liang | ............... | H01L 28/75 257/532 |
| 2015/0214150 A1* | 7/2015 | Chang | ............... | H01L 23/5256 257/529 |
| 2016/0035817 A1* | 2/2016 | Hsu | ............... | H01L 28/60 257/532 |
| 2017/0256498 A1 | 9/2017 | Standaert et al. | | |

OTHER PUBLICATIONS

Ohoka et al., "Integration of Self-Formed Barrier Technology for 32nm-Node Cu Dual-Damascene Interconnects with Hybrid Low-k (PAr/SiOC) Structure", In Digest of Technical Papers from IEEE Symposium on VLSI Technology, pp. 114-115 (2006).

Usui et al., "Highly Reliable Copper Dual-Damascene Interconnects With Self-Formed MnSixOy Barrier Layer", IEEE Transactions on Electron Devices, vol. 53, No. 10, pp. 2492-2498 (2006).

\* cited by examiner

LOW RESISTANCE METAL-INSULATOR-METAL CAPACITOR ELECTRODE

BACKGROUND

The present invention generally relates to semiconductor integrated circuits. The present invention more specifically relates to a low resistance metal-insulator-metal capacitor (MINICAP) electrode and methods of fabricating the same.

Advanced design rules for CMOS technology leads to faster switching speeds of the transistors integrated with a higher density on the semiconductor wafer. Large current spikes can occur due to a large number of "simultaneous" switching events in the circuit within a short period of time, which can cause considerable current-resistance drop and noise over the power supply network. Voltage fluctuation and power supply noise can impact signal integrity, speed and reliability of these devices. It has been shown that the addition of an on-chip decoupling MIMCAP can reduce this problem and enhance circuit performance. The MIMCAP can compensate for voltage fluctuations by delivering charges to the power-supply network.

SUMMARY

Embodiments of the present invention are generally directed to integrated circuits including one or more metal-insulator-metal capacitors and methods of fabrication. A non-limiting example of the metal-insulator-metal capacitor includes a copper alloy electrode having an alloying element and a barrier metal layer on the top and bottom surfaces thereof, and a self-formed metal oxide layer containing the alloying element on sidewalls of the copper alloy.

A non-limiting example of an integrated circuit according to aspects of the invention includes at least one layer including one or more metal-insulator-metal capacitors formed in an interlayer dielectric. Each one of the one or more metal-insulator-metal capacitors includes a top electrode, a bottom electrode, and a dielectric layer disposed between the top and bottom electrodes. The top electrode includes a copper alloy including an alloying element and a copper diffusion barrier layer on the top and bottom surfaces thereof, and a self-formed metal oxide layer containing the alloying element on sidewall surfaces of the copper alloy. The bottom electrode includes a copper alloy including an alloying element and a copper diffusion barrier layer on the top and bottom surfaces thereof, and a self-formed metal oxide layer containing the alloying element on sidewall surfaces of the copper alloy. Metal interconnects are provided in the interlayer dielectric to the top and bottom electrodes, wherein the interlayer dielectric contains oxygen.

A non-limiting example of a process for fabricating a metal-insulator-metal capacitor in an integrated circuit according to aspects of the invention includes depositing a plurality of layers onto a substrate, the plurality of layers including, in sequence, a first barrier layer, a bottom metal electrode layer including a copper alloy including an alloying element, a second barrier layer, a dielectric layer, third barrier layer, a top metal electrode layer including the copper alloy, and a fourth barrier layer. The third barrier layer, the top metal electrode layer, and the fourth barrier layer are patterned to define a top electrode. The dielectric layer is patterned such that the dielectric layer has a width equal to a width of the top electrode and underlies the top electrode. The second barrier layer, the bottom metal electrode layer, and the first barrier layer are patterned to define a bottom electrode. An interlayer dielectric is deposited on the top and bottom electrodes, wherein the interlayer dielectric contains oxygen and the alloying element in the copper alloy of the top and bottom electrodes is reacted with at least the oxygen in the interlayer dielectric to form an oxide on sidewalls of the top and bottom electrodes. The interlayer dielectric is patterned to form metal interconnects to the top and bottom electrodes, wherein the top and bottom electrodes and the dielectric layer therebetween define the metal-insulator-metal capacitor.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DETAILED DESCRIPTION

The present invention generally relates to integrated circuits including low resistance MIMCAP resistors and methods of fabricating the same. Low resistance and low inductance is desired to enable the efficient application of MIMCAPs at high frequencies. The use of copper, which has low bulk resistivity, can be used to reduce resistance of the metal electrode of the MIMCAP structure. However, in order to use a material such a copper for the electrode, the electrode needs to be completely encapsulated with a barrier metal (i.e., the barrier metal must be deposited above, below and side surfaces). In the absence of a barrier metal, the copper or other low bulk resistivity metal can diffuse into the surrounding dielectric and degrade the reliability of the devices. However, current processes for encapsulating the copper metal electrodes of the MIMCAP structure with a barrier metal requires numerous additional process steps.

Figure 1:
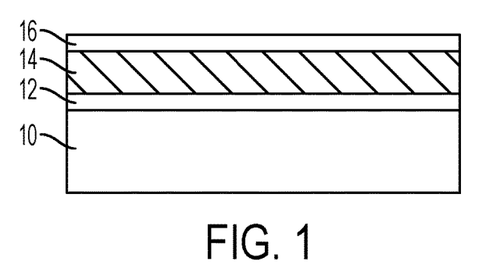
FIG. 1 depicts a cross section of an initial structure to form a MIMCAP structure, according to embodiments of the invention, following deposition of a lower barrier metal layer, a copper alloy layer and an upper barrier metal layer for forming a bottom electrode.

FIGS. 1-12 schematically illustrate a typical process flow for forming a MIMCAP that includes encapsulating the copper metal electrodes with a barrier metal. As shown in FIG. 1, the process generally beings with bottom electrode deposition. A lower barrier metal layer 12 is first deposited onto a substrate 10 followed by deposition of a copper metal 14. An upper barrier metal layer 16 is then deposited onto the copper layer. Typical metals utilized for the barrier metal layers include titanium, titanium nitride, tantalum, tantalum, nitride and the like.

Figure 2:
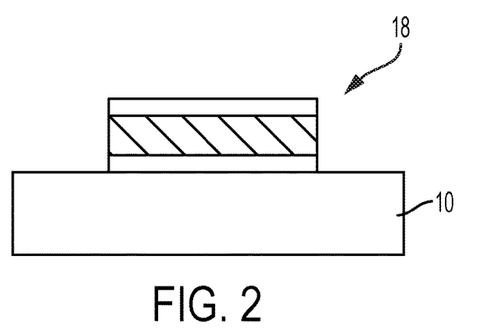
FIG. 2 depicts a cross section of the structure of FIG. 1 subsequent to patterning the lower barrier metal layer, the copper alloy layer and the upper barrier metal layer to define a width of the bottom electrode according to embodiments of the invention.
Figure 3:
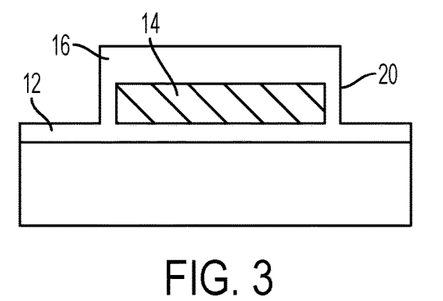
FIG. 3 depicts a cross section of the structure of FIG. 2 subsequent to conformal deposition of a barrier metal layer according to embodiments of the invention.
Figure 4:
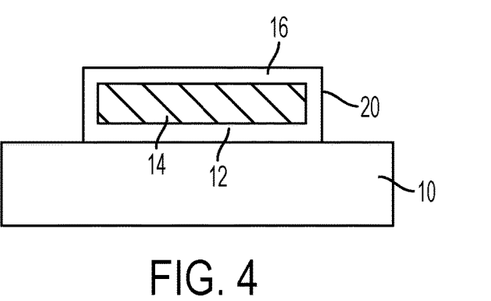
FIG. 4 depicts a cross section of the structure of FIG. 3 subsequent to removal of the conformal barrier metal layer from the substrate and from a top surface of the bottom electrode according to embodiments of the invention.

In FIGS. 2-3, the layers defining the bottom electrode 18 are patterned and a barrier metal layer 20 is conformally deposited onto the patterned bottom electrode 18, which results in covering the sidewalls of the bottom electrode with the barrier metal. In FIG. 4, the excess barrier metal is removed by etching. In this manner, the copper metal is completely encapsulated by barrier metal layers, i.e., barrier metal layer 12 covers the bottom surface of the copper metal, barrier metal layer 16 covers the top surface of the copper metal, and barrier metal layer 20 covers the sidewall surfaces of the copper metal.

Figure 5:
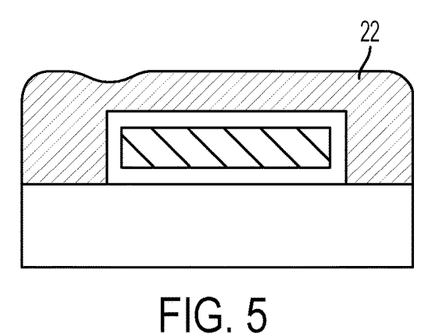
FIG. 5 depicts a cross section of the structure of FIG. 4 subsequent to deposition of a interlayer dielectric according to embodiments of the invention.
Figure 6:
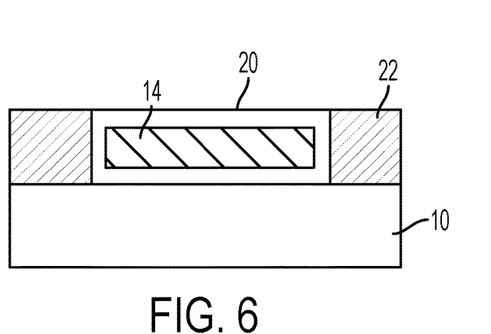
FIG. 6 depicts a cross section of the structure of FIG. 5 subsequent to planarization of the interlayer dielectric to the upper barrier metal according to embodiments of the invention.

In FIGS. 5-6, an interlayer dielectric 22 is deposited and subsequently subjected to a planarization process such as chemical mechanical planarization (CMP). The CMP process planarizes the surface by a combination of chemical and mechanical forces generally known in the art. By way of example, CMP can remove material through the physical grinding of a slurry containing abrasive particles such as silica, as well as through chemical action as a result of oxidizing agents such as hydrogen peroxide contained in the slurry. The planarization process stops at the barrier metal layer 20.

Figure 7:
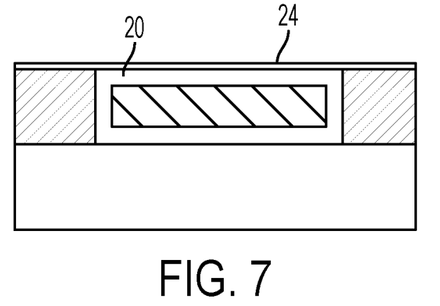
FIG. 7 depicts a cross section of the structure of FIG. 6 subsequent to deposition of a MIMCAP dielectric layer according to embodiments of the invention.
Figure 8:
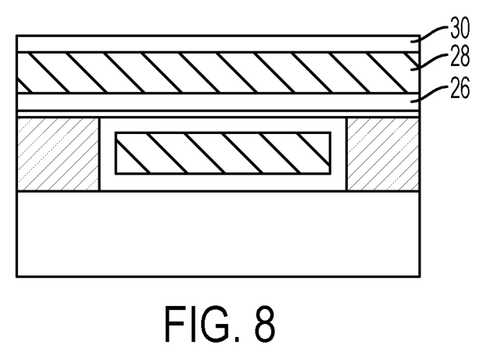
FIG. 8 depicts a cross section of the structure of FIG. 7 subsequent to deposition of a lower barrier metal layer, a copper alloy layer and an upper barrier metal layer for forming a top electrode according to embodiments of the invention.
Figure 9:
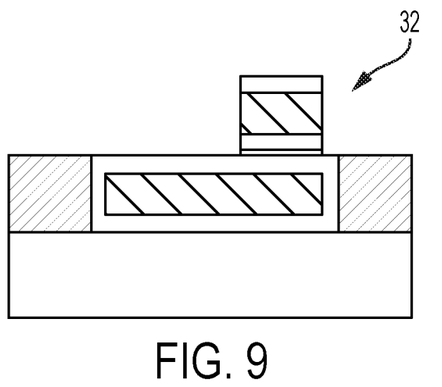
FIG. 9 depicts a cross section of the structure of FIG. 8 subsequent to patterning the lower barrier metal layer, the copper alloy layer and the upper barrier metal layer to define a width of the top electrode, and patterning of the MIMCAP dielectric layer according to embodiments of the invention.
Figure 10:
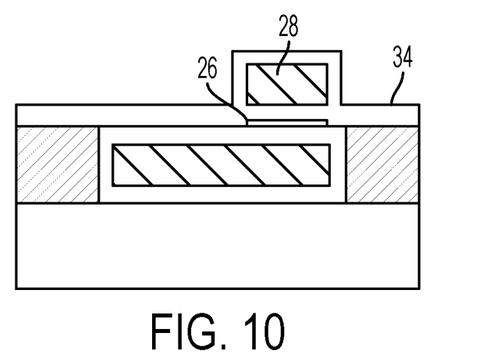
FIG. 10 depicts a cross section of the structure of FIG. 9 subsequent to conformal deposition of a barrier metal layer according to embodiments of the invention.

In FIG. 7, a MIMCAP dielectric layer 24 is blanket deposited onto the substrate covering the upper barrier metal 20 and the dielectric layer 22. In FIG. 8, the lower barrier metal layer 26 of the top electrode is first deposited followed by deposition of a copper layer 28 thereon. An upper barrier layer 30 of the top electrode is then deposited onto the copper layer 28. In FIGS. 9-10, layers 26, 28, and 30 are patterned to define the top electrode 32 and a conformal barrier metal layer 34 is deposited thereon to completely encapsulate the top electrode 32 with the previously deposited barrier metal layers 26, 30 and 34.

Figure 11:
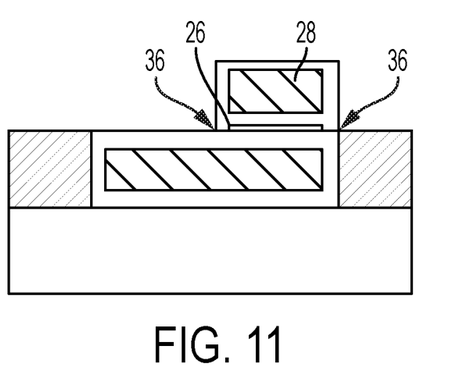
FIG. 11 depicts a cross section of the structure of FIG. 10 subsequent to removal of the conformal barrier metal layer from the substrate and from a top surface of the top electrode according to embodiments of the invention.

In FIG. 11, the excess barrier metal is removed, thereby completing the MIMCAP structure. As shown, by removing the excess barrier metal from the substrate, there remains significant risk of shorting between the top and bottom electrodes 32, 18, respectively. As indicated by arrows 36, shorting can occur at the MIMCAP dielectric interface between the electrodes.

Figure 12:
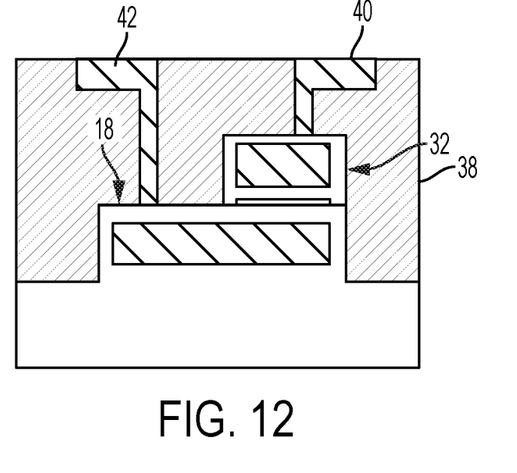
FIG. 12 depicts a cross section of the structure of FIG. 11 subsequent to deposition of an interlayer dielectric and patterning of the interlayer dielectric to form metal interconnects to the top and bottom electrodes of the MIMCAP structure according to embodiments of the invention.

In FIG. 12, an interlayer dielectric 38 is deposited, patterned and filled to provide metal interconnects 40, 42, to the respective top and bottom electrodes 32, 18, respectively. As demonstrated, the process of encapsulating the electrodes with a barrier metal for the MIMCAP structure requires multiple processing steps. However, subsequent to removal of the unwanted barrier metal as shown in FIG. 11, there remains a significant risk of shorting between the electrodes at the edges of the high k dielectric material. As will be described in greater detail herein, the present invention provides a MIMCAP structure that significantly minimizes the risk of shorting, prevents diffusion, and utilizes less processing steps used to form the electrodes. The MIMCAP structure includes a self-formed oxide sidewall barrier formed in situ. The electrodes in the MIMCAP structure are formed of a copper alloy, wherein the alloying element in the copper alloy is selected to be reactive with the interlayer dielectric layer during an annealing/curing step to form an oxide at the copper alloy/dielectric layer sidewall interface, which then functions as a copper diffusion barrier.

FIGS. 13-19 schematically illustrate a process flow for forming a MIMCAP including electrodes having a self-formed oxide sidewall barrier formed on sidewalls of the copper alloy conductor according to one or more embodiments of the invention.

Figure 13:
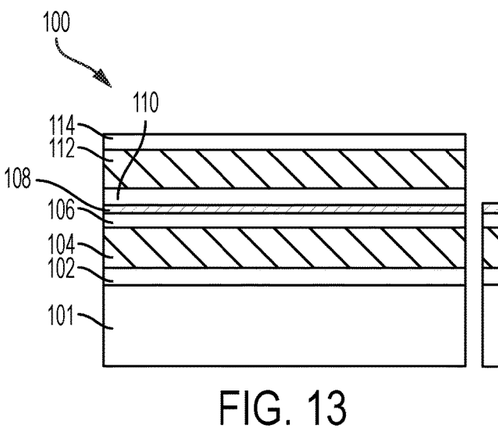
FIG. 13 depicts a cross section of an initial structure to form a MIMCAP structure following deposition of a lower barrier metal layer, a copper alloy layer and an upper barrier metal layer for forming a bottom electrode, deposition of a MIMCAP dielectric layer. and deposition of a lower barrier metal layer, a copper alloy layer and an upper barrier metal layer on the MIMCAP dielectric layer for forming a top electrode according to embodiments of the invention.

In FIG. 13, there is shown a portion of an integrated circuit 100 including a substrate 101, layers 102, 104, 106, 108, 110, 112, 114 deposited thereon that will define the MIMCAP structure. Layers 102, 104 and 106 include a lower barrier metal layer 102 (the "barrier metal layer" also referred to herein as a "diffusion barrier"), a copper alloy layer 104, and an upper barrier metal layer 106, respectively, which will define the bottom electrode of the MIMCAP structure. Similarly, layers 110, 112, and 114 include a lower barrier metal layer 110, a copper alloy layer 112, and an upper barrier metal layer 114, respectively, which will define the top electrode of the MIMCAP structure. Layer 108 is the MIMCAP dielectric layer, insulator, and is intermediate the upper barrier layer 106 associated with the bottom electrode and the lower barrier layer 110 associated with the top electrode.

The metals utilized for the barrier metal layers are not intended to be limited and can include titanium, titanium nitride, tantalum, tantalum nitride, tungsten, tungsten nitride, ruthenium, ruthenium nitride, cobalt, cobalt nitride, or combination thereof or the like. The barrier metal layer can have a thickness of about 10 Angstroms (Å) to about 500 Å. In one or more embodiments, the thickness can be from about 20 Å to about 300 Å, and in still one or more embodiments, the thickness came from 30 Å to about 200 Å. The barrier metal layers can be deposited by plasma vapor deposition. In one or more embodiments, the barrier metal layers are the same throughout the MIMCAP structure. In still one or more embodiments, at least one of the barrier metal layers is a different metal relative to the other barrier metal layers in the MIMCAP structure.

The copper alloy is not intended to be limited and includes one or more alloying elements reactive with an interlayer dielectric to form an oxide barrier layer on the electrode sidewalls of the final MIMCAP structure. Exemplary copper alloys include CuMn, CuAl, CuTi, CuSn, CuGe, CuMg, CuNi, and the like. In one or more embodiments, the amount of alloying element in the copper alloy is generally from about 0.1 to about 60 atomic percentage. In one or more other embodiments, the amount of alloying element in the copper alloy is generally from about 0.5 to about 40 atomic percentage; and in still one or more other embodiments, the amount of alloying element in the copper alloy is generally from about 1 to about 30 atomic percentage. In one or more embodiments, the copper alloy thickness is between 200 Å and 10,000 Å. The copper layer can be deposited by plasma vapor deposition (PVD), chemical vapor deposition (CVD), sputtering, atomic layer deposition (ALD), or the like.

The MIMCAP dielectric layer 108 can be chosen from any suitable insulating material including, but not limited to oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, mixtures thereof or the like. The dielectric can be applied by any suitable technique known to the art. In one or more embodiments, the dielectric layer is a high k dielectric, wherein the dielectric constant is greater than about 3.9. In one or more embodiments, the dielectric layer thickness is between 50 Å and 1,000 Å.

Figure 14:
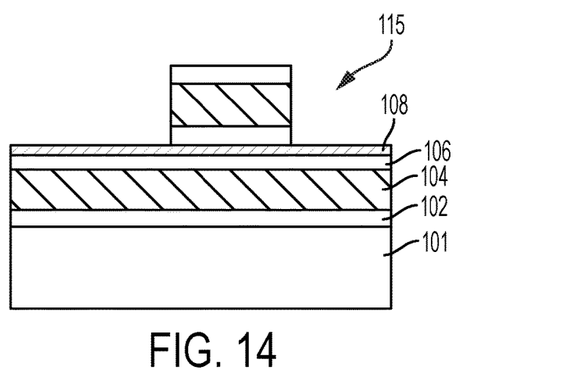
FIG. 14 depicts a cross section of the structure of FIG. 13 subsequent to patterning the lower barrier metal layer, the copper alloy layer and the upper barrier metal layer to the MIMCAP dielectric layer define a width of the top electrode according to embodiments of the invention.

In FIG. 14, the stack of layers 110, 112 and 114 defining the top electrode 115 is patterned to define the width of the top electrode. Patterning the different layers generally includes an etching process to the dielectric layer 108. The etching process can include wet or dry etching. An exemplary etching process includes reactive ion etching.

Figure 15:
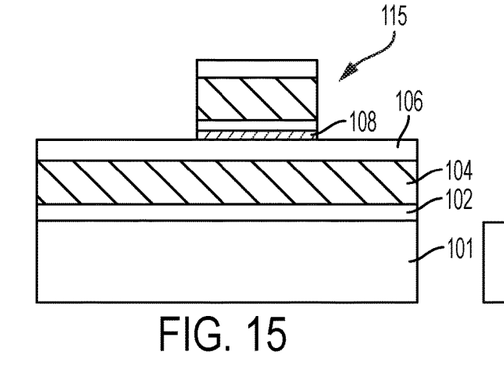
FIG. 15 depicts a cross section of the structure of FIG. 14 subsequent to patterning the MIMCAP dielectric layer according to embodiments of the invention.

In FIG. 15, the exposed portions of the MIMCAP dielectric layer 108 are selectively removed by a selective etching process such as reactive ion etching. As such the remaining dielectric layer underlies the top electrode 115.

Figure 16:
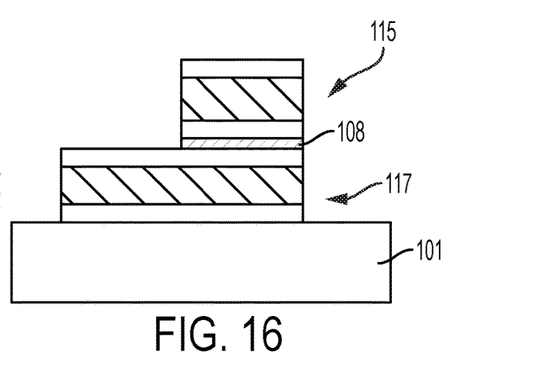
FIG. 16 depicts a cross section of the structure of FIG. 15 subsequent to patterning the lower barrier metal layer, the copper alloy layer and the upper barrier metal layer to define a width of the bottom electrode according to embodiments of the invention.

In FIG. 16, the stack of layers 102, 104 and 106 defining the bottom electrode is patterned to define the width of the bottom electrode 117. In one or more embodiments, the patterned bottom electrode 117 can have a width greater than the top electrode 115.

Figure 17:
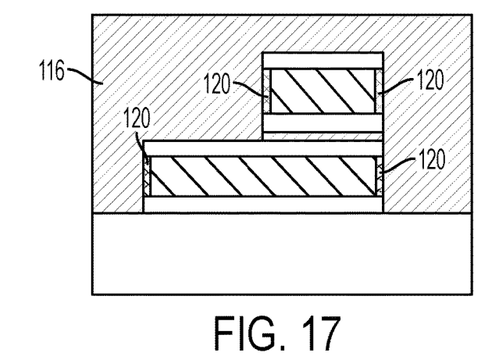
FIG. 17 depicts a cross section of the structure of FIG. 16 subsequent to deposition of an interlayer dielectric and self-formation of an oxide layer on sidewalls of the copper alloy according to embodiments of the invention.

In FIG. 17, an interlayer dielectric layer 116 is deposited and subsequently cured at an elevated temperature, wherein the particular temperature is generally specific to the materials defining the interlayer dielectric. The interlayer dielectric layer 116 can include 0 and at least one element selected from the group consisting of Si, C, and F. In one or more embodiments, the interlayer dielectric layer 116 can be made of $SiO_2$, $SiO_xC_y$, $SiO_xC_yH_z$, or $SiO_xF_y$. The interlayer dielectric is in direct contact with the exposed sidewalls of the copper alloy electrodes. Upon curing of the dielectric at the elevated temperature, the alloying element in the copper alloy reacts with the interlayer dielectric to self-form an oxide barrier layer 120 on the sidewalls. By way of example, a copper manganese alloy will react with oxygen and silicon in a silicon dioxide interlayer dielectric to form manganese silicon oxide ($MnSi_xO_y$, wherein x:y=1:3 to 3:5). The self-formed $MnSi_xO_y$ on the exposed copper alloy sidewalls prevents copper diffusion.

Optionally, an annealing step is provided prior to deposition of the interlayer dielectric. In this case, the formed self-aligned liner will be an oxide, e.g., Mn oxide, Al oxide, or the like depending on the alloying element in the copper alloy. After forming the alloy oxide layer, the interlayer dielectric can be deposited.

Figure 18:
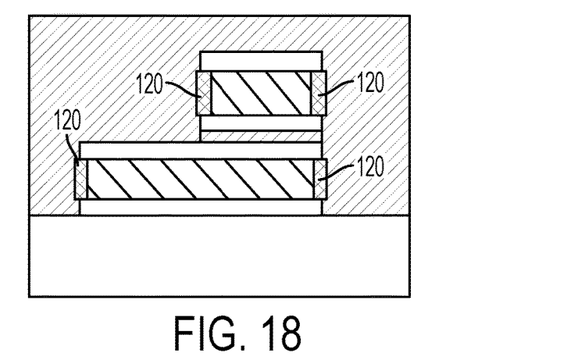
FIG. 18 depicts a cross section of the structure of FIG. 17 subsequent to annealing the structure to increase a thickness of the self-formed oxide layer according to embodiments of the invention.

In FIG. 18, the substrate is subjected to an annealing step at an elevated temperature greater than 300° C. It has been found that copper resistivity decreases as the annealing temperature increases such that the copper resistivity becomes almost the same as that of pure copper in the case of annealing at over 300° C. using CuMn alloys. Moreover, additional amounts of the self-formed oxide is formed increasing the thickness at the sidewalls of the copper electrodes. The thickness of the self-formed oxide layer on the sidewalls can have a thickness of about 2 Å to about 5 nanometers.

Figure 19:
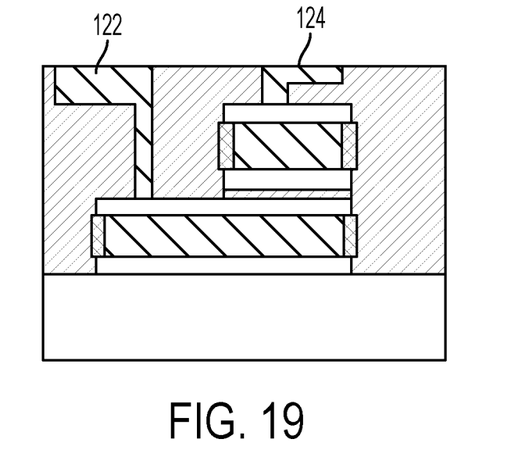
FIG. 19 depicts a cross section of the structure of FIG. 18 subsequent to forming metal interconnects to the top and bottom electrodes of the MIMCAP structure according to embodiments of the invention.

In FIG. 19, metal interconnects are formed to contact the top and bottom electrodes. Interlayer dielectric 116 is masked, etched and filled with an electrode material to form electrical contacts 122 to the top electrode and 124 to the bottom electrode. Electrical contacts 118 and 120 can be formed of copper, but can be any suitable conductor including, but not limited to Cu, Al, AlCu, Ti, TiN, Ta, TaN, W, WN, MoN, Pt, Pd, Os, Ru, $IrO_2$, $ReO_2$, $ReO_3$, alloys thereof, and mixtures thereof.

Detailed embodiments of the integrated circuit including a low resistance MIMCAP structure and methods for fabricating an integrated circuit including the low resistance MIMCAP structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS s, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A metal-insulator-metal capacitor comprising:
   a top copper alloy electrode and a bottom copper alloy electrode each comprising an alloying element and a barrier metal layer on the top and bottom surfaces thereof, wherein the barrier metal layer comprises titanium, titanium nitride, tantalum, tantalum nitride, tungsten, tungsten nitride, ruthenium, ruthenium nitride, cobalt, cobalt nitride, or combination thereof, the top and bottom copper alloy electrodes being spaced apart by a dielectric layer therebetween;
   an interlayer dielectric including oxygen and at least one element selected from the group consisting of Si, C, and F, wherein the interlayer dielectric completely covers and is in contact with the sidewalls of the top and bottom copper alloy electrodes; and
   a self-formed metal oxide layer containing a reaction product between the alloying element and the interlayer dielectric on the sidewalls of the top and bottom copper alloy electrodes, the self-formed metal oxide layer protruding from sides of the bottom copper alloy electrode and extending beyond sides of the dielectric layer.

2. The metal-insulator-metal capacitor of claim 1, wherein a portion of the self-formed metal oxide layer on the top copper alloy electrode is separated from another portion of the self-formed metal oxide layer on the bottom copper alloy electrode by the barrier metal layer and the dielectric layer.

3. The metal-insulator-metal capacitor of claim 1, wherein the dielectric layer comprises a high k dielectric layer.

4. The metal-insulator-metal capacitor of claim 1, wherein the dielectric layer comprises oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, or mixtures thereof.

5. The metal-insulator-metal capacitor of claim 1, wherein the alloying element is selected from the group consisting of manganese, aluminum, titanium, tin, germanium, magnesium, nickel, and combinations thereof.

6. The metal-insulator-metal capacitor of claim 1, wherein the alloying element is in an amount from about 0.1 to about 60 atomic percent.

7. The metal-insulator-metal capacitor of claim 1, wherein the self-formed oxide layer is derived from an interlayer dielectric reactive with the alloying element, the interlayer dielectric comprising $SiO_2$, $SiO_xC_y$, $SiO_xC_yH_z$, or $SiO_xF_y$.

8. An integrated circuit comprising:
   at least one layer comprising one or more metal-insulator-metal capacitors formed in an interlayer dielectric, each one of the one or more metal-insulator-metal capacitors comprising:
      a top electrode comprising a copper alloy including an alloying element and a copper diffusion barrier layer on the top and bottom surfaces thereof, wherein the copper diffusion barrier layer comprises titanium, titanium nitride, tantalum, tantalum nitride, tungsten, tungsten nitride, ruthenium, ruthenium nitride, cobalt, cobalt nitride, or combination thereof;
      a bottom electrode comprising a copper alloy including an alloying element and the copper diffusion barrier layer on the top and bottom surfaces thereof, the top and bottom electrodes being spaced apart by a dielectric layer therebetween; and
      a interlayer dielectric disposed between the top and bottom electrodes including oxygen and at least one element selected from the group consisting of Si, C, and F, wherein the dielectric layer completely covers and is in contact with the sidewalls of the top and bottom electrodes; and
      a self-formed metal oxide layer containing a reaction product between the alloying element and the interlayer dielectric on the sidewalls of the top and bottom electrodes, the self-formed metal oxide layer protruding from sides of the bottom copper alloy electrode and extending beyond sides of the dielectric layer; and
   metal interconnects formed in the interlayer dielectric to the top and bottom electrodes, wherein the interlayer dielectric contains oxygen.

9. The integrated circuit of claim 8, wherein the dielectric layer is a high k dielectric layer.

10. The integrated circuit of claim 8, wherein the alloying element is in an amount from about 0.1 to about 20 atomic percent.

11. The integrated circuit of claim 8, wherein the dielectric layer comprises oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, or mixtures thereof.

12. The integrated circuit of claim 8, wherein the alloying element is selected from the group consisting of manganese, aluminum, titanium, tin, germanium, magnesium, nickel, and combinations thereof.

13. The integrated circuit of claim 8, wherein the self-formed oxide layer is derived from an interlayer dielectric reactive with the alloying element, the interlayer dielectric comprising $SiO_2$, $SiO_xC_y$, $SiO_xC_yH_z$, or $SiO_xF_y$.

14. A method for fabricating a metal-insulator-metal capacitor in an integrated circuit, the method comprising:
   depositing a plurality of layers onto a substrate, the plurality of layers comprising, in sequence, a first barrier layer, a bottom metal electrode layer comprising a copper alloy including an alloying element, a second barrier layer, a dielectric layer, third barrier layer, a top metal electrode layer comprising the copper alloy, a fourth barrier layer wherein the first, second, third and fourth barrier layers on the respective bottom electrode layer and the top metal electrode layer comprise titanium, titanium nitride, tantalum, tantalum nitride, tungsten, tungsten nitride, ruthenium, ruthenium nitride, cobalt, cobalt nitride, or combination thereof;
   patterning the third barrier layer, the top metal electrode layer, and the fourth barrier layer to define a top electrode;
   patterning the dielectric layer such that the dielectric layer has a width equal to a width of the top electrode and underlies the top electrode;
   patterning the second barrier layer, the bottom metal electrode layer, and the first barrier layer to define a bottom electrode;
   depositing an interlayer dielectric on the top and bottom electrodes, wherein the interlayer dielectric contains oxygen, wherein the interlayer dielectric is formed of a material including oxygen and at least one element selected from the group consisting of Si, C, and F, wherein the interlayer dielectric completely covers and is in contact with the sidewalls of the top and bottom electrodes;

reacting the alloying element in the copper alloy of the top and bottom electrodes with at least the oxygen in the interlayer dielectric to form a reaction product therebetween containing a metal oxide on sidewalls of the top and bottom electrodes, the self-formed metal oxide layer protruding from sides of the bottom copper alloy electrode and extending beyond sides of the dielectric layer; and patterning the interlayer dielectric to form metal interconnects to the top and bottom electrodes, wherein the top and bottom electrodes and the dielectric layer therebetween define the metal-insulator-metal capacitor.

15. The method of claim 14, wherein depositing the plurality of layers comprises plasma vapor deposition.

16. The method of claim 14, wherein the alloying element is selected from the group consisting of manganese, aluminum, titanium, tin, germanium, magnesium, nickel, and combinations thereof.

17. The method of claim 14, wherein reacting the alloying element to form the oxide on sidewalls comprises annealing the interlayer dielectric at a temperature greater than 300° C.

18. The method of claim 14, wherein the interlayer dielectric comprises $SiO_2$, $SiO_xC_y$, $SiO_xC_yH_z$, or $SiO_xF_y$.

19. The method of claim 14, wherein the dielectric layer comprises oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, or mixtures thereof.

\* \* \* \* \*